United States Patent
Yoshinaga et al.

(10) Patent No.: US 9,350,140 B2
(45) Date of Patent: May 24, 2016

(54) QUANTUM CASCADE LASER AND METHOD FOR MANUFACTURING QUANTUM CASCADE LASER

(71) Applicant: SUMITOMO ELECTRIC INDUSTRIES, LTD., Osaka (JP)

(72) Inventors: Hiroyuki Yoshinaga, Yokohama (JP); Junichi Hashimoto, Chigasaki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/701,826

(22) Filed: May 1, 2015

(65) Prior Publication Data
US 2015/0318668 A1 Nov. 5, 2015

(30) Foreign Application Priority Data
May 1, 2014 (JP) .................................. 2014-094714

(51) Int. Cl.
| | |
|---|---|
| H01S 5/34 | (2006.01) |
| H01S 5/227 | (2006.01) |
| H01S 5/343 | (2006.01) |
| H01S 5/30 | (2006.01) |
| H01S 5/02 | (2006.01) |
| H01S 5/028 | (2006.01) |

(52) U.S. Cl.
CPC ............. *H01S 5/3401* (2013.01); *H01S 5/0203* (2013.01); *H01S 5/0287* (2013.01); *H01S 5/2275* (2013.01); *H01S 5/3013* (2013.01); *H01S 5/34313* (2013.01)

(58) Field of Classification Search
CPC ... H01S 5/3401; H01S 5/2275; H01S 5/0203; H01S 5/3013; H01S 5/34313
See application file for complete search history.

(56) References Cited

U.S. PATENT DOCUMENTS

| | | | | |
|---|---|---|---|---|
| 6,301,282 B1 * | 10/2001 | Capasso | ................. | B82Y 20/00 372/46.01 |
| 2013/0329761 A1 * | 12/2013 | Hashimoto | ........... | H01S 5/3401 372/45.012 |
| 2014/0247851 A1 * | 9/2014 | Hashimoto | ............ | B82Y 20/00 372/45.012 |

OTHER PUBLICATIONS

Fujita, K. et al., "High-performance, homogeneous broad-gain quantum cascade lasers based on dual-upper-state design" *Applied Physics Letters* 96, 241107 (2010).

\* cited by examiner

*Primary Examiner* — Dung Nguyen
(74) *Attorney, Agent, or Firm* — Smith, Gambrell & Russell, LLP.

(57) ABSTRACT

A quantum cascade laser includes a substrate having first and second regions; a stacked semiconductor layer disposed on the second region, the stacked semiconductor layer including an active layer, the stacked semiconductor layer having a first end facet and a second end facet that constitute a laser cavity; an insulating layer disposed on the first end facet and an upper surface of the stacked semiconductor layer, the insulating layer having an opening on the upper surface; a conductive layer disposed on the insulating layer and in the opening, the conductive layer being in contact with the upper surface through the opening; and a metal layer disposed on the conductive layer on the first end facet and the upper surface. The first end facet of the stacked semiconductor layer is retreated from an end facet of the substrate to a boundary between the first and second regions.

7 Claims, 8 Drawing Sheets

QUANTUM CASCADE LASER AND METHOD FOR MANUFACTURING QUANTUM CASCADE LASER

BACKGROUND OF THE INVENTION

1. Field of the Invention

The present invention relates to a quantum cascade laser and a method for manufacturing a quantum cascade laser.

2. Description of the Related Art

A quantum cascade laser having a high reflection (HR) coating is disclosed in APPLIED PHYSICS LETTERS vol. 96, Issue 24, 241107, 2010. The quantum cascade laser is bonded epi-side up on a cupper sub-mount with indium solder. At threshold, a high voltage of about 10 volts is applied to the quantum cascade laser to obtain a laser oscillation.

SUMMARY OF THE INVENTION

A quantum cascade laser has a large threshold current and a high operation voltage of 6 to 10 volts, for example. As a result, the quantum cascade laser has a large power consumption of more than 1 watt (W). In order to reduce the power consumption of the quantum cascade laser, some techniques have been studied. For example, a quantum cascade laser has a Fabry-Perot type laser cavity that includes two mirrors and a gain medium between the mirrors. In this case, the reflectance of the mirror is increased to reduce a mirror loss and thereby, reduce the threshold current. The reduction in the threshold current is useful in reducing the power consumption. In order to increase the reflectance of the mirror of the laser cavity, a high reflection (HR) coating film is formed on the end facet of the quantum cascade laser. As the high reflection (HR) coating film, a metal film made of, for example, Au is used. Meanwhile, the quantum cascade laser is mounted on a sub-mount by using a soldering material, e.g., indium (In). However, when the metal film is formed on the end facet of the quantum cascade laser, this soldering material flows to the end facet and reacts with the metal film in mounting the quantum cascade laser on the sub-mount. As a result, the reflectance of the mirror is reduced so that lasing characteristics and reliability of the quantum cascade laser are degraded.

A quantum cascade laser according to an aspect of the present invention includes a substrate having a first region and a second region arranged in a waveguiding direction; a stacked semiconductor layer disposed on the second region of the substrate, the stacked semiconductor layer including an active layer, the stacked semiconductor layer having a first end facet and a second end facet that constitute a laser cavity; an insulating layer disposed on the first end facet and an upper surface of the stacked semiconductor layer, the insulating layer having an opening on the upper surface of the stacked semiconductor layer; a conductive layer disposed on the insulating layer and in the opening, the conductive layer being in contact with the upper surface of the stacked semiconductor layer through the opening; and a metal layer disposed on the conductive layer on the first end facet and an upper surface of the stacked semiconductor layer. The first end facet of the stacked semiconductor layer is retreated from an end facet of the substrate to a boundary between the first region and the second region of the substrate in the waveguiding direction.

A method for manufacturing a quantum cascade laser, according to another aspect of the present invention, includes the steps of forming a stacked semiconductor layer including an active layer on a substrate having a first region and a second region arranged in a first axis direction; forming a mask on the epitaxial stacked semiconductor layer, the mask having a stripe-shaped pattern disposed on the second region and an opening located on the first region, the stripe-shaped pattern extending in the first axis direction; forming a stripe-shaped semiconductor mesa on the second region and a groove on the first region by etching the stacked semiconductor layer using the mask; forming an insulating layer on an upper surface and an end facet of the stripe-shaped semiconductor mesa; forming an opening in the insulating layer on the upper surface of the stacked semiconductor layer so as to expose the upper surface of the stacked semiconductor layer through the opening of the insulating layer; forming a conductive layer on the insulating layer and in the opening of the insulating layer in contact with the upper surface of the stacked semiconductor layer; forming a metal layer on the conductive layer disposed on the upper surface and the end facet of the stripe-shaped semiconductor mesa; and dividing the substrate into a laser chip along a second axis direction intersecting the first axis direction at a bottom surface of the groove. The end facet of the stripe-shaped semiconductor mesa is retreated from an end facet of the substrate to a boundary between the first region and the second region of the substrate in the first axis direction.

The above-described objects, other objects, features, and advantages of the present invention will become more apparent easily from the following detailed description of preferred embodiments of the present invention with reference to the attached drawings.

BRIEF DESCRIPTION OF THE DRAWINGS

In FIG. 2A, the alumina film has a thickness of 600 nm. In FIG. 2B, the alumina film has a thickness of 100 nm.

DESCRIPTION OF THE PREFERRED EMBODIMENTS

Some embodiments will be described below.

A quantum cascade laser according to an embodiment includes (a) a substrate having a first region and a second region arranged in a waveguiding direction; (b) a stacked semiconductor layer disposed on the second region of the substrate, the stacked semiconductor layer including an active layer, the stacked semiconductor layer having a first end facet and a second end facet that constitute a laser cavity; (c) an insulating layer disposed on the first end facet and an upper surface of the stacked semiconductor layer, the insulating layer having an opening on the upper surface of the stacked semiconductor layer; (d) a conductive layer disposed on the insulating layer and in the opening, the conductive layer being in contact with the upper surface of the stacked semiconductor layer through the opening; and (e) a metal layer disposed on the conductive layer on the first end facet and an upper surface of the stacked semiconductor layer. The first end facet of the stacked semiconductor layer is retreated from an end facet of the substrate to a boundary between the first region and the second region of the substrate in the waveguiding direction.

According to this quantum cascade laser, the metal layer is disposed on the upper surface and the first end facet of the stacked semiconductor layer. The first end facet of the stacked semiconductor layer constitutes a laser cavity by serving a reflection mirror of the laser cavity. The metal layer disposed on the first end facet of the stacked semiconductor layer increases a reflectance of the first end facet.

The first end facet of the stacked semiconductor layer is located at the boundary between the first region and the second region of the substrate and is retreated from the end facet of the substrate so as to form a set-back structure. Consequently, in mounting the quantum cascade laser on a sub-mount, this set-back structure avoids the electrical conductor including the conductive layer and the metal layer on the first end facet of the stacked semiconductor layer from coming into contact with the soldering material such as indium (In) solder. In addition, the quantum cascade laser includes the insulating layer between the conductive layer and the upper surface of the stacked semiconductor layer. The insulating layer is also disposed between the conductive layer and the first end facet of the stacked semiconductor layer. Therefore, the first end facet and the upper surface of the stacked semiconductor layer is protected and insulated electrically by the insulating layer. Even when the insulating layer is disposed between the conductive layer and the first end facet of the stacked semiconductor layer, the high reflectance of the first end facet with the metal layer is maintained.

In a quantum cascade laser according to an embodiment, the stacked semiconductor layer preferably constitutes a semiconductor mesa extending in the waveguiding direction. The first end facet and the second end facet of the stacked semiconductor layer correspond to end facets of the semiconductor mesa that are opposed to each other in the waveguiding direction.

In a quantum cascade laser according to an embodiment, the first end facet of the stacked semiconductor layer with the metal layer may have a reflectance of more than 70%. In addition, the metal layer may be made of a gold film, and the metal layer may have a thickness of 50 nm or more.

In a quantum cascade laser according to an embodiment, the first end facet of the stacked semiconductor layer preferably has a reflectance larger than a reflectance of the second end facet of the stacked semiconductor layer. According to this quantum cascade laser, the first end facet serves as a light reflection surface and the second end facet serves as a light emission surface from which light is emitted toward the outside.

In a quantum cascade laser according to an embodiment, the substrate preferably has a third region arranged adjacent to the second region in the waveguiding direction. The insulating layer is disposed on the second end facet of the stacked semiconductor layer. The metal layer is disposed on the conductive layer on the second end facet of the stacked semiconductor layer. The second end facet of the stacked semiconductor layer is preferably retreated from another end facet of the substrate to a boundary between the second region and the third region of the substrate in the waveguiding direction. In addition, the metal layer disposed on the second end facet has a thickness smaller than a thickness of the metal layer disposed on the first end facet. According to this quantum cascade laser, the second end facet of the stacked semiconductor layer serves as a light emission surface.

In a quantum cascade laser according to an embodiment, the second end facet of the stacked semiconductor layer may have a cleavage surface. According to this quantum cascade laser, a large optical output is obtained from the second end facet of the stacked semiconductor layer serving as a light emission surface.

A method for manufacturing a quantum cascade laser, according to another embodiment, includes the steps of (a) forming a stacked semiconductor layer including an active layer on a substrate having a first region and a second region arranged in a first axis direction; (b) forming a mask on the epitaxial stacked semiconductor layer, the mask having a stripe-shaped pattern disposed on the second region and an opening located on the first region, the stripe-shaped pattern extending in the first axis direction; (c) forming a stripe-shaped semiconductor mesa on the second region and a groove on the first region by etching the stacked semiconductor layer using the mask; (d) forming an insulating layer on an upper surface and an end facet of the stripe-shaped semiconductor mesa; (e) forming an opening in the insulating layer on the upper surface of the stacked semiconductor layer so as to expose the upper surface of the stacked semiconductor layer through the opening of the insulating layer; (f) forming a conductive layer on the insulating layer and in the opening of the insulating layer in contact with the upper surface of the stacked semiconductor layer; (g) forming a metal layer on the conductive layer disposed on the upper surface and the end facet of the stripe-shaped semiconductor mesa; and (h) dividing the substrate into a laser chip along a second axis direction intersecting the first axis direction at a bottom surface of the groove. The end facet of the stripe-shaped semiconductor mesa is retreated from an end facet of the substrate to a boundary between the first region and the second region of the substrate in the first axis direction.

In the method for manufacturing a quantum cascade laser according to an embodiment, in the step of forming the conductive layer, the conductive layer is preferably formed by using an oblique evaporation method in which a flux of evaporated particles is obliquely incident on the substrate from a slanting direction relative to a principal surface of the substrate.

In the method for manufacturing a quantum cascade laser according to an embodiment, preferably, the metal layer is made of a gold film, and the metal layer is formed by using a plating method.

The findings of the present invention will be understood easily in consideration of the following detailed description with reference to the attached drawings shown as examples. The embodiments related to the quantum cascade laser and the method for manufacturing the quantum cascade laser, according to the present invention, will be described below with reference to the attached drawings. The same portions are indicated by the same reference numerals, where possible.

Figure 1A:
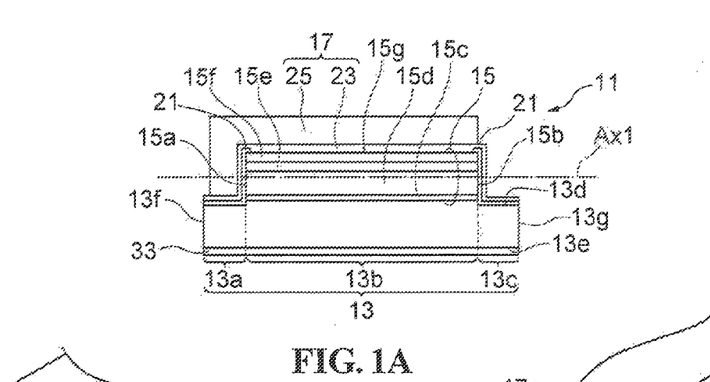
FIGS. 1A to 1C are diagrams schematically showing a quantum cascade laser according to the present embodiment.
Figure 1B:
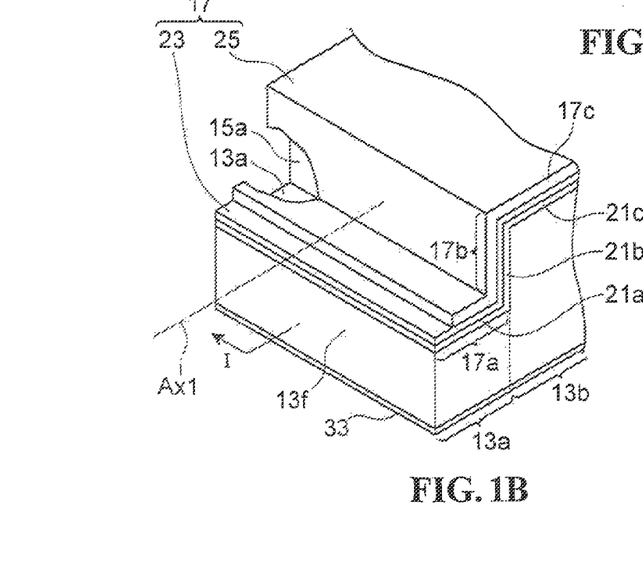
Figure 1C:
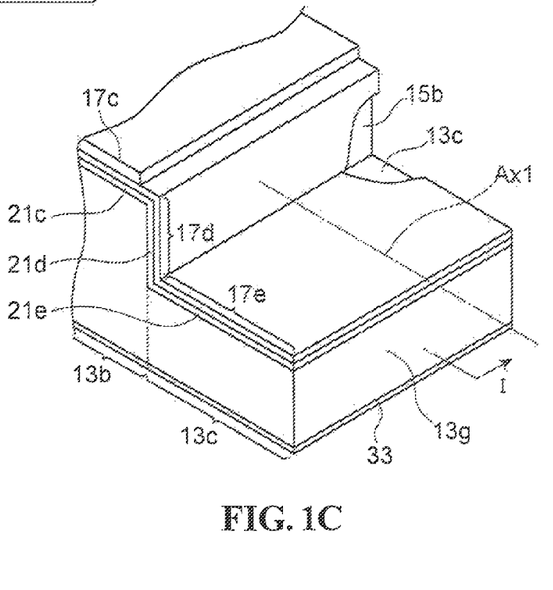

FIGS. 1A, 1B, and 1C are diagrams schematically showing a quantum cascade laser (QCL) according to the present embodiment. Referring to FIGS. 1A, 1B, and 1C, a quantum cascade laser 11 is shown as an example of the present embodiment. The quantum cascade laser 11 includes a Fabry-Perot type laser cavity. The quantum cascade laser 11 includes a substrate 13, a stacked semiconductor layer 15, and an electrical conductor 17. FIG. 1B is a magnified perspective view showing one end portion of the quantum cascade laser 11. FIG. 1C is a magnified perspective view showing the other end portion of the quantum cascade laser 11. FIGS. 1B and 1C are cutaway views showing the surfaces of the substrate 13 and the stacked semiconductor layer 15. FIG. 1A shows a cross-section taken along a line IA-IA shown in FIGS. 1B and 1C. The substrate 13 has a first region 13a, a second region 13b, and a third region 13c. The first region 13a, the second region 13b, and the third region 13c are arranged in a waveguiding direction along a first axis Ax1. The substrate 13 has a principal surface 13d and a back surface 13e located on the side opposite to the principal surface 13d. The stacked semiconductor layer 15 is disposed on the second region 13b of the substrate 13. The stacked semiconductor layer 15 has a first end facet 15a and a second end facet 15b opposite to the first end facet 15a. The first end facet 15a and the second end facet 15b intersect the first axis Ax1. The first end facet 15a and the second end facet 15b constitute the Fabry-Perot type laser cavity. That is, the first end facet 15a and the second end facet 15b serve as a reflective mirror of the Fabry-Perot type laser cavity. The stacked semiconductor layer 15 constitutes a stripe-shaped semiconductor mesa extending in the waveguiding direction along the first axis Ax1. In the embodiment, a buried region is formed on a side surface of the stripe-shaped semiconductor mesa and on the substrate 13. The stripe-shaped semiconductor mesa is embedded with the buried region. The first end facet 15a of the stacked semiconductor layer 15 is located at the boundary between the first region 13a and the second region 13b of the substrate 13. The second end facet 15b of the stacked semiconductor layer 15 is located at the boundary between the second region 13b and the third region 13c of the substrate 13.

The substrate 13 has a first end facet 13f and a second end facet 13g. Each of the first end facet 13f and the second end facet 13g of the substrate 13 extends along a reference plane intersecting the direction of the first axis Ax1. The first end facet 15a of the stacked semiconductor layer 15 is retreated toward the center of the quantum cascade laser 11 with reference to the first end facet 13f of the substrate 13.

The stripe-shaped semiconductor mesa of the stacked semiconductor layer 15 includes a first cladding layer 15c, an active layer 15d, a second cladding layer 15e, and a contact layer 15f that are stacked in this order on the substrate 13. The active layer 15d includes a multi-quantum well (MQW) structure to constitute a quantum cascade laser. Specifically, the active layer 15d has a cascade structure in which stacked layer units each composed of an emission layer having a quantum well structure and an injection layer are stacked in a multistage manner. The first cladding layer 15c and the second cladding layer 15e include III-V compound semiconductors having the same electrical conductivity type (in the embodiment, n-type). The contact layer 15f includes a III-V compound semiconductor having the same electrical conductivity type as that of the second cladding layer 15e.

An example of the stacked semiconductor layer 15 will be described below.
Substrate 13: n-type InP. A plane orientation of principal surface of the substrate is a (100) plane.
First cladding layer 15c: n-type InP
Active layer 15d: GaInAs/AlInAs MQW structure
Second cladding layer 15e: n-type InP
Contact layer 15f: n-type GaInAs
Buried region embedding the stripe-shaped semiconductor mesa: semi-insulating InP Direction of stripe-shaped semiconductor mesa: <110> crystal axial direction Quantum cascade laser 11 generates laser light in the infrared region and the wavelength thereof is within the range of, for example, 4 μm to 10 μm.

The electrical conductor 17 extends from the upper surface 15g of the stacked semiconductor layer 15 to the first end facet 15a of the stacked semiconductor layer 15. In the present embodiment, the electrical conductor 17 is disposed on the first region 13a and the second region 13b of the substrate 13 and the upper surface 15g and the first end facet 15a of the stacked semiconductor layer 15. The upper surface 15g of the stacked semiconductor layer 15 corresponds to the top surface of the contact layer 15f.

The electrical conductor 17 has a first portion 17a, a second portion 17b, and a third portion 17c. The first portion 17a is disposed on the first region 13a of the substrate 13. The second portion 17b is disposed on the first end facet 15a of the stacked semiconductor layer 15. The third portion 17c is disposed on the upper surface 15g of the stacked semiconductor layer 15.

The electrical conductor 17 includes a conductive layer 23 and a metal layer 25 disposed on the conductive layer 23. The conductive layer 23 includes an electrode which is in contact with the upper surface 15g of the stacked semiconductor layer 15. The metal layer 25 includes, for example, at least one gold layer. The conductive layer 23 contains Ti/Au, for example. The thickness of the conductive layer 23 is smaller than the thickness of the metal layer 25. The thickness of the conductive layer 23 is within the range of, for example, 10 nm to 600 nm. An electrode 33 is disposed on the back surface 13e of the substrate 13. This electrode 33 is placed at a distance corresponding to the thickness of the substrate 13 from the electrical conductor 17 because of a set-back structure in which the first end facet is retreated with reference to the substrate end facet. In this structure, the electrical conductor 17 is not formed on the first end facet 13f of the substrate 13. In a step of mounting the quantum cascade laser on a sub-mount by using a soldering material in an epi-side-up configuration, for example, the soldering material comes into contact with the electrode 33. However, this set-back structure avoids the electrical conductor 17 from coming into contact with the soldering material.

According to this quantum cascade laser 11, the electrical conductor 17 extends from the upper surface 15g of the stacked semiconductor layer 15 to the first end facet 15a of the stacked semiconductor layer 15. Therefore, the metal layer 25 is disposed on the first end facet 15a of the stacked semiconductor layer 15 that constitutes one of the mirrors of the laser cavity. The reflectance of the first end facet 15a is increased by forming the metal layer 25 on the first end facet 15a.

The first end facet 15a of the stacked semiconductor layer 15 is located at the boundary between the first region 13a and the second region 13b of the substrate 13 and is retreated from the first end facet 13f of the substrate 13 to form the set-back structure. The first end facet 15a of the stacked semiconductor layer 15 having the metal layer 25 has a high reflectance and serves as the mirror of the laser cavity. In the set-back structure, the electrical conductor 17 including the metal layer 25 is not formed on the first end facet 13f of the substrate 13. In mounting the quantum cascade laser 11 on the sub-mount in the epi-side-up configuration, this set-back structure avoids the metal layer 25 in the electrical conductor 17 from being in contact with the electrode 33 through the soldering material.

The distance between the lower end of the first end facet 15a of the stacked semiconductor layer 15 and the upper end of the first end facet 13f of the substrate 13 (amount of retreat) is, for example, 15 μm in the direction of the first axis Ax1. This distance (amount of retreat) is preferably 10 μm or more in consideration of variation in the position at which a wafer is divided into the individual chips by cleavage, for example.

In the quantum cascade laser 11, the conductive layer 23 and the metal layer 25 are disposed on the first end facet 15a of the stacked semiconductor layer 15. The conductive layer 23 is also disposed on the second end facet 15b of the stacked semiconductor layer 15. The metal layer 25 is disposed on the first end facet 15a. Therefore, the reflectance of the first end facet 15a is increased. In the embodiment, the reflectance of the first end facet 15a is set to be larger than the reflectance of the second end facet 15b. The second end facet 15b serves as an emission end facet to emit laser light to the outside.

In the quantum cascade laser 11 shown in FIGS. 1A to 1C, the stacked semiconductor layer 15 is not disposed on the third region 13c of the substrate 13. Therefore, the second end facet 15b of the stacked semiconductor layer 15 is retreated toward the center of the quantum cascade laser 11 with reference to the second end facet 13g of the substrate 13. The second end facet 15b of the stacked semiconductor layer 15 is located at the boundary between the second region 13b and the third region 13c of the substrate 13. In the embodiment, the first end facet 13f and the second end facet 13g of the substrate 13 are formed by cleavage.

In the present embodiment, the electrical conductor 17 is disposed on the third region 13c of the substrate 13 and the second end facet 15b of the stacked semiconductor layer 15. The electrical conductor 17 has a fourth portion 17d and a fifth portion 17e in addition to the first portion 17a, the second portion 17b, and the third portion 17c. The fourth portion 17d is disposed on the second end facet 15b of the stacked semiconductor layer 15. The fifth portion 17e is disposed on the third region 13c of the substrate 13. The electrical conductor 17 extends from the upper surface 15g of the stacked semiconductor layer 15 through the first end facet 15a of the stacked semiconductor layer 15 to the first region 13a of the substrate 13. In addition, the electrical conductor 17 extends from the upper surface 15g of the stacked semiconductor layer 15 through the second end facet 15b of the stacked semiconductor layer 15 to the third region 13c of the substrate 13. In order to control the reflectance of the first end facet 15a and the second end facet 15b, the thickness of the metal layer 25 is adjusted. For example, the metal layer 25 formed on the second end facet 15b has a smaller thickness than the thickness of the metal layer 25 formed on the first end facet 15a. The metal layer 25 may be not formed on the second end facet 15b. An anti-reflection (AR) coating may be formed on the second end facet 15b to increase output power of light from the second end facet 15b.

An insulating layer 21 is disposed on the first region 13a and the second region 13b of the substrate 13 and the upper surface 15g and the first end facet 15a of the stacked semiconductor layer 15. The insulating layer 21 is disposed between the substrate 13 and the electrical conductor 17 in the first region 13a and the second region 13b of the substrate 13. In addition, the insulating layer 21 is disposed between the upper surface 15g of the stacked semiconductor layer 15 and the electrical conductor 17, and the insulating layer 21 is also disposed between the first end facet 15a of the stacked semiconductor layer 15 and the electrical conductor 17. The insulating layer 21 has a first portion 21a, a second portion 21b, and a third portion 21c. The first portion 21a is disposed on the first region 13a of the substrate 13. The second portion 21b is disposed on the first end facet 15a of the stacked semiconductor layer 15. The third portion 21c is disposed on the upper surface 15g of the stacked semiconductor layer 15. The insulating layer 21 has an opening on the upper surface 15g of the stacked semiconductor layer 15. The electrical conductor 17 is disposed in the opening of the insulating layer 21. The conductive layer 23 of the electrical conductor 17 is in contact with the upper surface 15g of the stacked semiconductor layer 15 through the opening of the insulating layer 21. The insulating layer 21 is made of, for example, alumina (aluminum oxide), SiN, or $SiO_2$.

In the quantum cascade laser 11 shown in FIGS. 1A to 1C, the stacked semiconductor layer 15 is not disposed on the third region 13c of the substrate 13. Therefore, the insulating layer 21 is also disposed on the third region 13c of the substrate 13 and the second end facet 15b of the stacked semiconductor layer 15. The insulating layer 21 is disposed between the substrate 13 and the electrical conductor 17 in the third region 13c of the substrate 13. In addition, the insulating layer 21 is disposed between the second end facet 15b of the stacked semiconductor layer 15 and the electrical conductor 17. The insulating layer 21 has a fourth portion 21d and a fifth portion 21e in addition to the first portion 21a, the second portion 21b, and the third portion 21c. The fourth portion 21d is disposed on the second end facet 15b of the stacked semiconductor layer 15. The fifth portion 21e is disposed on the third region 13c of the substrate 13.

In the present embodiment, the insulating layer 21 integrally extends from the upper surface 15g of the stacked semiconductor layer 15 through the first end facet 15a of the stacked semiconductor layer 15 to the first region 13a of the substrate 13. In addition, the insulating layer 21 integrally extends from the upper surface 15g of the stacked semiconductor layer 15 through the second end facet 15b of the stacked semiconductor layer 15 to the third region 13c of the substrate 13. In this quantum cascade laser 11, the insulating layer 21 electrically insulates the stacked semiconductor layer 15 and the substrate 13 from the electrical conductor 17. Furthermore, the insulating layer 21 avoids electrical connection between the first cladding layer 15c, the active layer 15d, the second cladding layer 15e, and the contact layer 15f in the stacked semiconductor layer 15 at the first and second end facets 15a and 15b of the stacked semiconductor layer 15 through the electrical conductor 17.

Figure 2A:
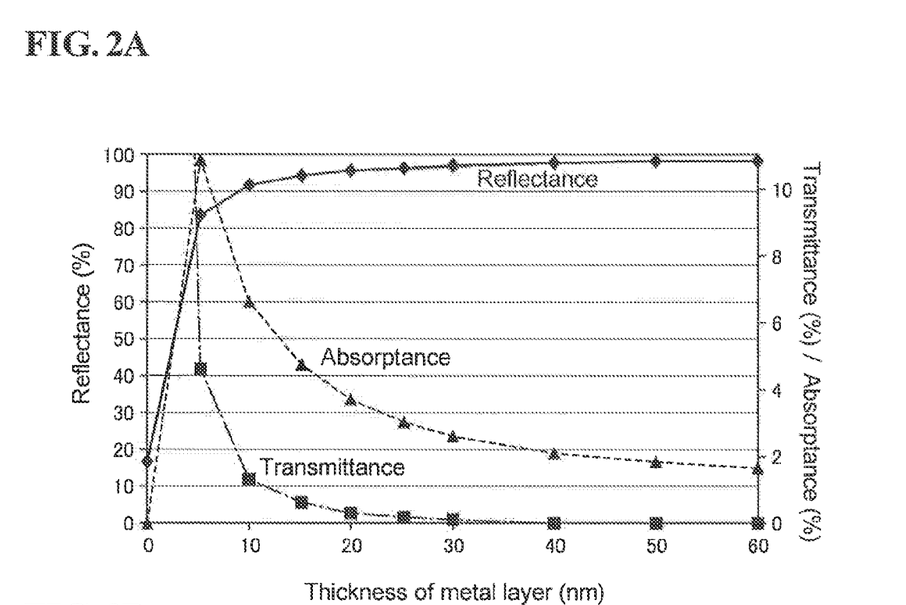
FIGS. 2A and 2B show a relationship between a thickness of a metal layer and a reflectance, a transmittance, and an absorptance of the end facet of the quantum cascade laser for light having a wavelength ($\lambda$) of 7.54 μm. On the end facet of the quantum cascade laser, an alumina (aluminum oxide) film and the metal layer are disposed. The alumina film is disposed between the end facet and the metal film. The metal film is made of Au.
Figure 2B:
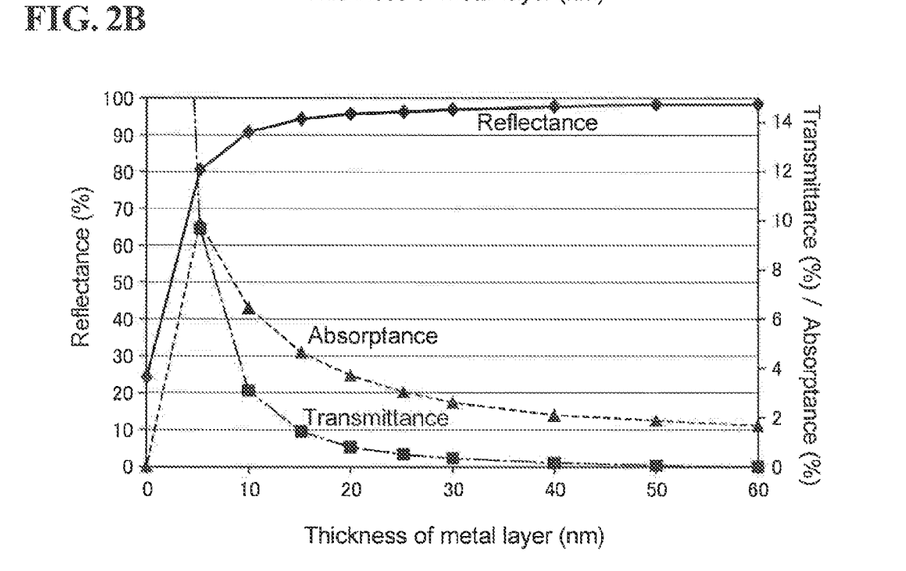

FIGS. 2A and 2B show the relationship between the thickness of the metal layer and the reflectance, the transmittance, and the light absorptance of the end facet of the stacked semiconductor layer for light having a wavelength (λ) of 7.54 μm. The insulating layer and the metal layer are disposed on the end facet of the stacked semiconductor layer. The insulating layer is disposed between the metal layer and the end facet of the stacked semiconductor layer. The metal layer is made of Au, and the insulating layer is made of alumina (alumina film). FIG. 2A shows the reflectance, the transmittance, and the light absorptance of the end facet with the alumina film having a thickness of 600 nm. FIG. 2B shows the reflectance, the transmittance, and the light absorptance of the end facet with the alumina film having a thickness of 100 nm.

Referring to FIGS. 2A and 2B, the metal layer 25 having a thickness of 50 nm or more provides very high reflectance of more than 95%. The first end facet 15a and the second end facet 15b of the stacked semiconductor layer 15 serve as the mirrors of the laser cavity. In the embodiment, the first end facet 15a serves as the mirror having a high reflectance by forming the metal layer having a relatively large thickness. In this case, the second end facet 15b serves as a light emission surface. Preferably, the metal layer 25 has a thickness of 5 nm or more and 30 nm or less to control the reflectance and the transmittance of the end facet of the stacked semiconductor layer. When the metal layer 25 having such a thickness is utilized, the reflectance of the end facet of the stacked semiconductor layer is controlled in the range of 70% to 95%.

A structure of a quantum cascade laser different from the quantum cascade laser 11 shown in FIGS. 1A to 1C may be formed by disposing the stacked semiconductor layer 15 on the third region 13c of the substrate 13 and cleaving the substrate 13 and the stacked semiconductor layer 15 simultaneously at the same position. In this structure, the second end facet 15b of the stacked semiconductor layer 15 and the second end facet 13g of the substrate 13 have a cleavage surface that is integrally formed by cleaving the substrate 13 and the stacked semiconductor layer 15 simultaneously. This cleavage surface extends from the upper end of the second end facet 15b of the stacked semiconductor layer 15 to the lower end of the second end facet 13g of the substrate 13 along a single reference plane.

FIGS. 3A to 3D are diagrams schematically showing some typical quantum cascade lasers according to the present embodiment. In FIGS. 3A to 3D, the quantum cascade lasers emit output light OUT from the second end facet 15b of the stacked semiconductor layer 15 toward the outside.

Figure 3A:
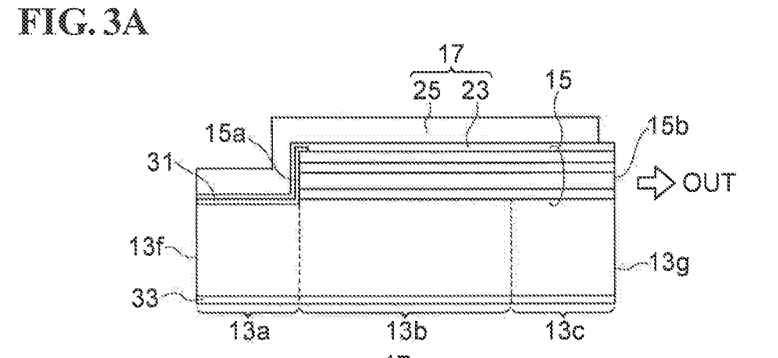
FIGS. 3A to 3D are diagrams schematically showing some typical quantum cascade lasers according to the present embodiment.

Referring to FIG. 3A, the first end facet 15a is retreated from the first end facet 13f of the substrate 13. In addition, the conductive layer 23 and the metal layer 25 are disposed on the upper surface 15g and the first end facet 15a of the stacked semiconductor layer 15. An insulating layer 31 is disposed on the first region 13a of the substrate 13 and on the first end facet 15a and the upper surface 15g of the stacked semiconductor layer 15. The insulating layer 31 has an opening on the upper surface 15g of the stacked semiconductor layer 15. The electrical conductor 17 including the conductive layer 23 and the metal layer 25 is disposed on the insulating layer 31 and in the opening of the insulating layer 31. The conductive layer 23 is in contact with the upper surface 15g of the stacked semiconductor layer 15 through the opening. In the present embodiment, the metal layer 25 is made of gold (Au) and has a thickness of 50 nm or more. The second end facet 15b has a cleavage surface formed together with the second end facet 13g of the substrate 13. The cleavage surface extends from the upper edge of the quantum cascade laser (upper edge of the stacked semiconductor layer) to the lower edge (lower edge of the substrate). In the quantum cascade laser shown in FIG. 3A, the electrical conductor 17 including the metal layer 25 is not disposed on the second end facet 15b. Therefore, the reflectance of the second end facet 15b is smaller than the reflectance of the first end facet 15a. A large optical output power is obtained for the quantum cascade laser shown in FIG. 3A.

Figure 3B:
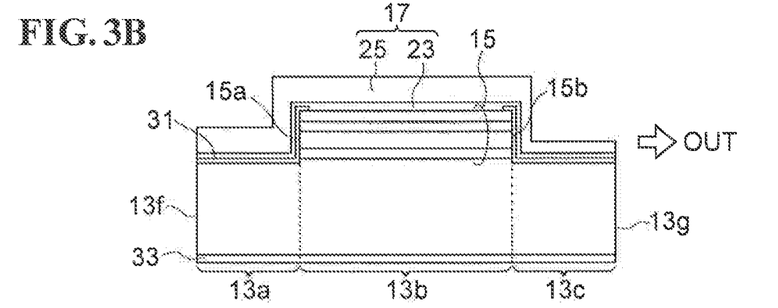

Referring to FIG. 3B, the first end facet 15a is retreated from the first end facet 13f of the substrate 13. Also, the second end facet 15b is retreated from the second end facet 13g of the substrate 13. The conductive layer 23 and the metal layer 25 are disposed on the first end facet 15a, the upper surface 15g, and the second end facet 15b of the stacked semiconductor layer 15. An insulating layer 31 is disposed on the first region 13a and the third region 13c of the substrate 13 and on the first end facet 15a, the upper surface 15g, and the second end facet 15b of the stacked semiconductor layer 15. The insulating layer 31 has an opening on the upper surface 15g of the stacked semiconductor layer 15. The electrical conductor 17 including the conductive layer 23 and the metal layer 25 is disposed on the insulating layer 31 and in the opening of the insulating layer 31. The conductive layer 23 is in contact with the upper surface 15g of the stacked semiconductor layer 15 through the opening. In the present embodiment, the metal layer 25 disposed on the second end facet 15b has a thickness within the range of 5 to 30 nm to serve as the light emission surface. The metal layer 25 disposed on the first end facet 15a has a thickness of 50 nm or more to serve as the light reflection surface. In the embodiment, the metal layer 25 on the second end facet 15b includes a first gold layer having a thickness within the range of, for example, 5 to 30 nm. The metal layer 25 on the first end facet 15a includes the first gold layer and a second gold layer on the first gold layer to achieve 50 nm or more (total thickness). Alternatively, the metal layer 25 on the first end facet 15a and the metal layer 25 on the second end facet 15b may be formed in separate steps. In the quantum cascade laser shown in FIG. 3B, the first end facet 15a has a large reflectance of 95% or more, and the second end facet 15b has a reflectance in the range of 70% to 95%. The first end facet 15a and the second end facet 15b constitute a high reflection (HR) mirror of the laser cavity. As a result, the quantum cascade laser shown in FIG. 3B has a lower threshold current as compared with the quantum cascade laser shown in FIG. 3A.

Figure 3C:
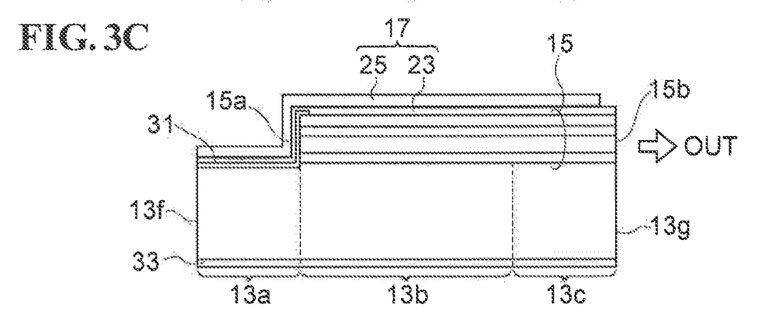

Referring to FIG. 3C, the first end facet 15a is retreated from the first end facet 13f of the substrate 13. The conductive layer 23 and the metal layer 25 are disposed on the upper surface 15g and the first end facet 15a of the stacked semiconductor layer 15. An insulating layer 31 is disposed on the first region 13a of the substrate 13 and on the first end facet 15a and the upper surface 15g of the stacked semiconductor layer 15. The insulating layer 31 has an opening on the upper surface 15g of the stacked semiconductor layer 15. The electrical conductor 17 including the conductive layer 23 and the metal layer 25 is disposed on the insulating layer 31 and in the opening of the insulating layer 31. The conductive layer 23 is in contact with the upper surface 15g of the stacked semiconductor layer 15 through the opening. In the present embodiment, the metal layer 25 on the first end facet 15a has a thickness within the range of 5 to 30 nm. The reflectance of the first end facet 15a is adjusted in the range of 70% to 95%. Therefore, in the quantum cascade laser shown in FIG. 3C, light is also emitted from the first end facet 15a. The light emitted from the first end facet 15a is used for monitoring an optical power of the quantum cascade laser. The second end facet 15b has a cleavage surface formed together with the second end facet 13g of the substrate 13. In the quantum cascade laser shown in FIG. 3C, the electrical conductor 17 including the metal layer 25 is not disposed on the second end facet 15b.

When the metal layer 25 has a thickness of about 30 nm or less, the metal layer 25 is formed by using an evaporation method, for example. When the metal layer 25 has a thickness of more than 30 nm, the metal layer 25 is formed by using a plating method.

Figure 3D:
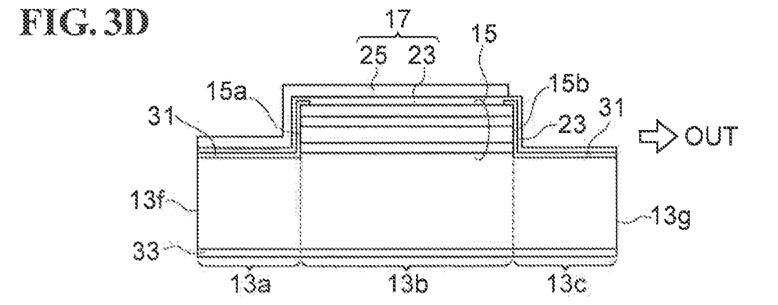

Referring to FIG. 3D, the first end facet 15a is retreated from the first end facet 13f of the substrate 13. The second end facet 15b is also retreated from the second end facet 13g of the substrate 13. The conductive layer 23 and the metal layer 25 are disposed on the first end facet 15a and the upper surface of the stacked semiconductor layer 15. The conductive layer 23 is disposed on the second end facet 15b without disposing the metal layer 25. The metal layer 25 is disposed on the first end facet 15a. An insulating layer 31 is disposed on the first region 13a and the third region 13c of the substrate 13 and on the first end facet 15a, the upper surface 15g, and the second end facet 15b of the stacked semiconductor layer 15. The insulating layer 31 has an opening on the upper surface 15g of the stacked semiconductor layer 15. The conductive layer 23 is disposed on the insulating layer 31 and in the opening of the insulating layer 31. The conductive layer 23 is in contact with the upper surface 15g of the stacked semiconductor layer 15 through the opening. The thickness of the metal layer 25 (gold layer) on the first end facet 15a is within the range of 5 to 30 nm so as to adjust the reflectance of the first end facet 15a in the range of 70% to 95%. Therefore, light is also emitted from the first end facet 15a. The light emitted from the first end facet 15a is used for monitoring an optical power of the quantum cascade laser. In the present embodiment, the metal layer 25 is not disposed on the second end facet 15b. Therefore, a relatively high optical output is obtained for the quantum cascade laser shown in FIG. 3D.

Figure 4A:
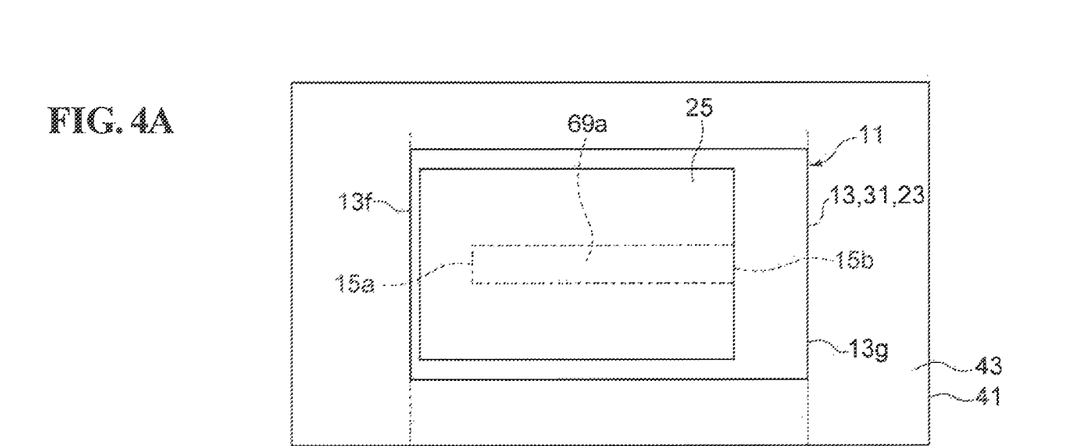
FIGS. 4A and 4B are diagrams schematically showing a mounted quantum cascade laser.
Figure 4B:
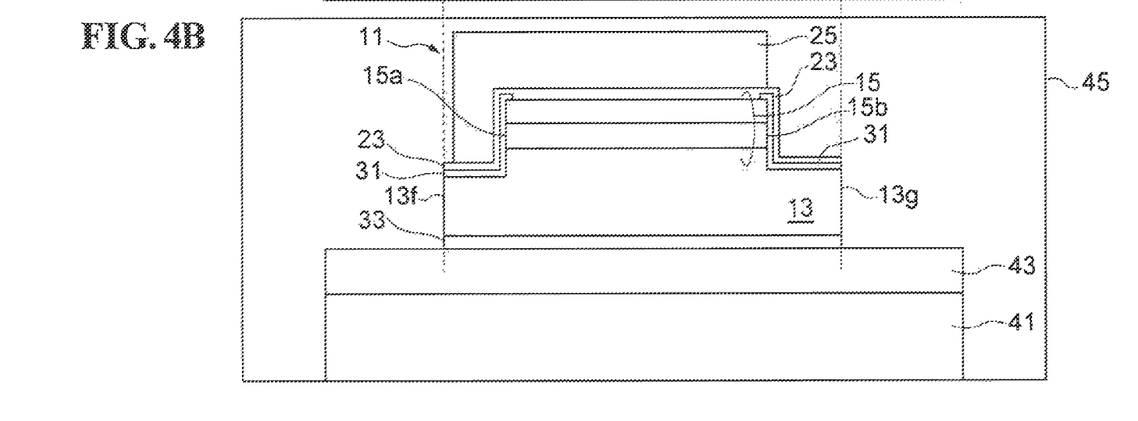

FIGS. 4A and 4B are diagrams schematically showing a quantum cascade laser mounted on a sub-mount in the epi-side-up configuration. Referring to FIG. 4A, the quantum cascade laser 11 is mounted on a sub-mount 41 with a soldering material 43 therebetween. The soldering material 43 is made of, for example, indium (In). The sub-mount 41 is made of thermally conductive insulating material such as AlN. As shown in FIG. 4B, the metal layer 25 is placed at a distance corresponding to the thickness of the substrate 13 from the soldering material 43 because of retreat of the end facet constituting the optical cavity. The quantum cascade laser 11 on the sub-mount 41 is stored in a housing 45.

Figure 5A:
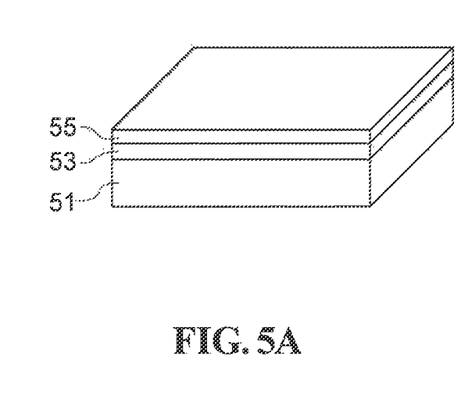
FIGS. 5A to 5C are diagrams schematically showing main steps in a method for manufacturing a quantum cascade laser.
Figure 5B:
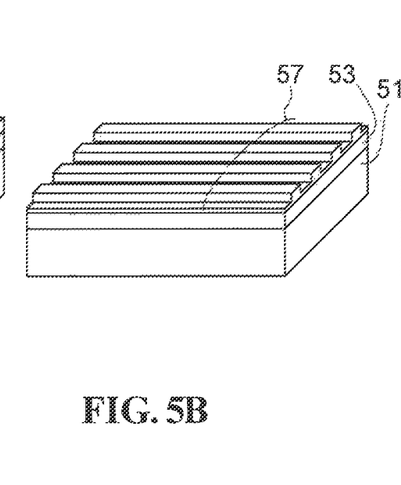
Figure 5C:
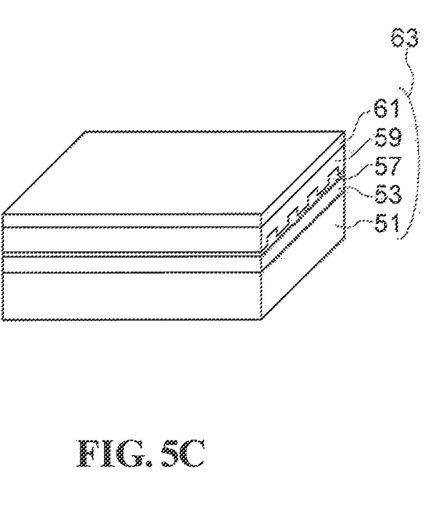

A method for manufacturing a quantum cascade laser will be described with reference to FIG. 5A to FIG. 7C. Initially, a substrate 51 is prepared. A plurality of device forming regions in which the quantum cascade lasers are formed is arranged on the substrate 51 in an array. In the following explanations, for the sake of clarity, single device forming region is shown in the drawing. As shown in FIG. 5A, an active layer 53 and a diffraction grating layer 55 are grown sequentially on the substrate 51 by using a metal-organic vapor phase epitaxy (MOVPE) method. If necessary, a lower cladding layer may be grown prior to growing of the active layer 53. The substrate 51 is made of n-type InP. The diffraction grating layer 55 is formed of an n-type InGaAs layer (thickness, 500 nm). Subsequently, as shown in FIG. 5B, a diffraction grating 57 is formed in the diffraction grating layer 55 by using photolithography and etching. After the diffraction grating 57 is formed, as shown in FIG. 5C, an upper cladding layer 59 and a contact layer 61 are grown sequentially on the diffraction grating 57 by the MOVPE method. A stacked semiconductor layer 63 is formed through these steps. The diffraction grating 57 includes periodic projections and recesses that are alternately arranged in the waveguiding direction. The emission wavelength of the quantum cascade laser is determined by the period of the diffraction grating. In the following explanations, one device forming region (substrate) has a first region and a second region arranged along the first axis Ax1 shown in FIGS. 1A and 1B in the waveguiding direction.

Figure 6A:
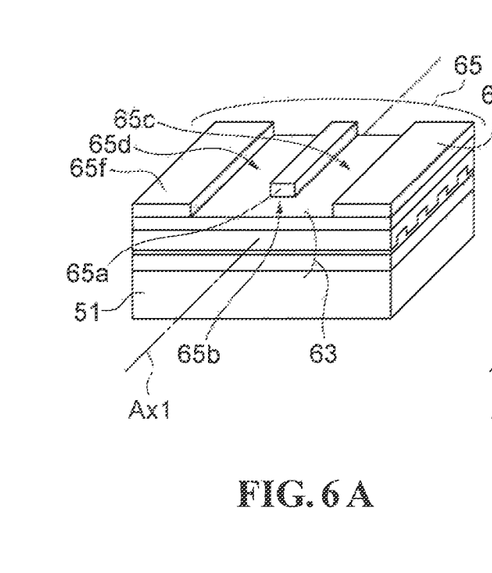
FIGS. 6A to 6C are diagrams schematically showing main steps in a method for manufacturing a quantum cascade laser.

As shown in FIG. 6A, a mask 65 to form a stripe-shaped semiconductor mesa is formed on the stacked semiconductor layer 63. The mask 65 has a stripe-shaped pattern 65a extending in the waveguiding direction along the first axis Ax1 on the second region of the substrate 51 and an opening 65b on the first region of the substrate 51. The pattern of the opening 65b of the mask 65 is used for forming a groove in the stacked semiconductor layer 63 as described below. The mask 65 has a first trench opening 65c and a second trench opening 65d to define the stripe-shaped pattern 65a. The first trench opening 65c is disposed between the stripe-shaped pattern 65a and a first terrace pattern 65e. The second trench opening 65d is disposed between the stripe-shaped pattern 65a and a second terrace pattern 65f. The mask 65 is formed of a dielectric film such as a SiN film, a SiO$_2$ film, or a SiON film. The dielectric film is formed by using a chemical vapor deposition (CVD) method. In order to form the mask 65, a photolithography technique, and an etching technique are used.

Figure 6B:
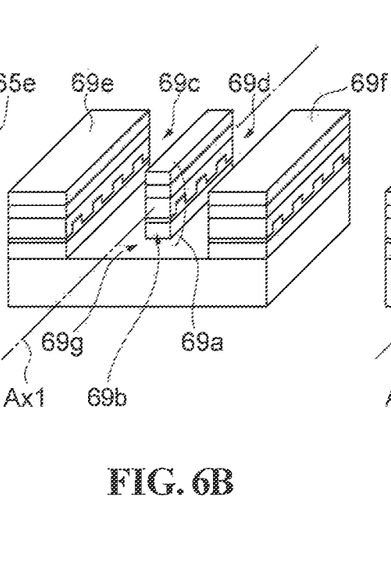

After the mask 65 is formed, as shown in FIG. 6B, the stacked semiconductor layer 63 is etched by using the mask 65 to form a stacked semiconductor layer 69a extending in the waveguiding direction along the first axis Ax1 on the second region of the substrate 51. This etching is performed by using a dry etching method such as a reactive ion etching (RIE) method or an ion milling method. After the etching, the mask 65 is removed. The stacked semiconductor layer 69a has a first end facet 69b (first end facet 15a) located at the boundary between the first region and the second region of the substrate 51. The stacked semiconductor layer 63 is etched in accordance with the opening 65b of the mask 65 and, thereby, the first end facet 69b (first end facet 15a) located at the boundary between the first region and the second region of the substrate 51 is formed. The first end facet 69b is defined by a groove 69g connecting the first trench groove 69c and the second trench groove 69d to each other. The first end facet 69b extends in a direction intersecting the direction of the first axis Ax1. This groove 69g also extends in the direction intersecting the direction of the first axis Ax1. The stacked semiconductor layer 69a is disposed between the first trench groove 69c and the second trench groove 69d. The first trench groove 69c is disposed between the stripe-shaped stacked semiconductor layer 69a and a first terrace 69e. The second trench groove 69d is disposed between the stripe-shaped stacked semiconductor layer 69a and a second terrace 69f.

Figure 6C:
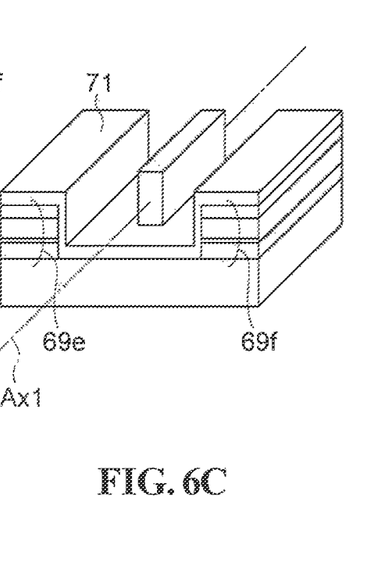

After the removal of the mask 65, as shown in FIG. 6C, an insulating layer 71 is formed on the entire surface of a wafer including the stacked semiconductor layer 69a on the substrate 51. The insulating layer 71 covers the entire surface of the stacked semiconductor layer 69a and, therefore, the insulating layer 71 is disposed on the upper surface and the first end facet 69b of the stacked semiconductor layer 69a. The insulating layer 71 is made of alumina (aluminum oxide), SiN, or SiO$_2$, and is formed by using a CVD method or a sputtering method, for example.

Figure 7A:
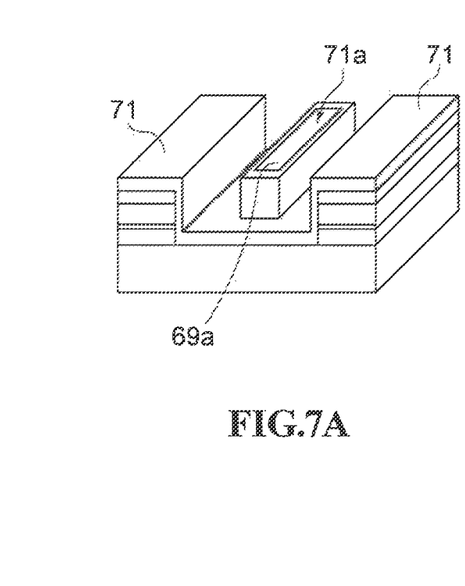
FIGS. 7A to 7C are diagrams schematically showing main steps in a method for manufacturing a quantum cascade laser.
Figure 7B:
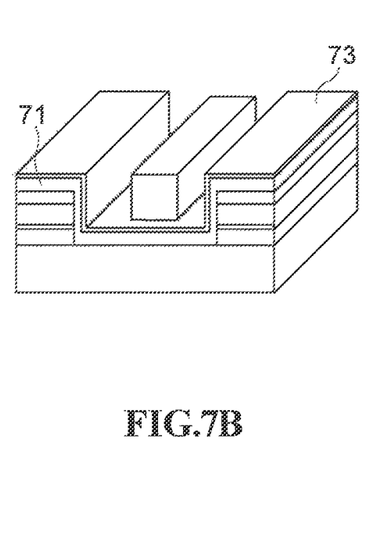
Figure 7C:
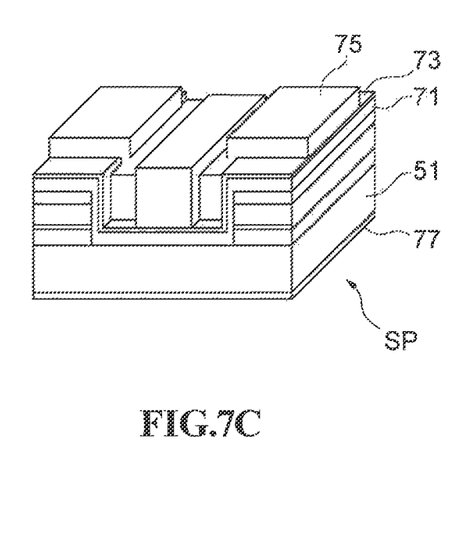

As shown in FIG. 7A, an opening 71a is formed in the insulating layer 71 on the upper surface of the stacked semiconductor layer 69a. The upper surface of the stacked semiconductor layer 69a is exposed through the opening 71a. Thereafter, as shown in FIG. 7B, an electrical conductor layer 73 is formed on the entire surface of the wafer. As a result, the electrical conductor layer 73 is formed on the bottom surface (first region of the substrate 51) of the groove 69g, the side surface of the groove 69g (first end facet 69b of the stacked semiconductor layer 69a), and the upper surface of the stacked semiconductor layer 69a. The electrical conductor layer 73 is also formed in the opening 71a of the insulating layer 71 in contact with the upper surface of the stacked semiconductor layer 69a. The electrical conductor layer 73 is formed on not only the bottom surface of the groove 69g (first region of the substrate 51) but also the side surface of the groove 69g (first end facet 69b of the stacked semiconductor layer 69a). Therefore, preferably, the electrical conductor layer 73 is formed by an oblique evaporation method in which a flux of evaporated particles is obliquely incident on the substrate 51 from a slanting direction relative to a principal surface of the substrate 51. By using the oblique evaporation method, the electrical conductor layer 73 having a uniform thickness is formed on the first end facet 69b of the stacked semiconductor layer 69a (side surface of the groove 69g) which is substantially perpendicular to the principal surface of the substrate 51. In the process of forming the electrical conductor layer 73 using the oblique evaporation method, a stage supporting the substrate 51 in the evaporation apparatus is rotated and revolved during the evaporation so as to improve uniformity of the thickness of the electrical conductor layer 73 on the first end facet 69b of the stacked semiconductor layer 69a. The inclination angle relative to the principal surface of the substrate 51 is set to be, for example, 30 degrees. It is preferable to set the inclination angle relative to the principal surface of the substrate 51 to be within the angle range of 10 degrees to 30 degrees. After the formation of the electrical conductor layer 73, as shown in FIG. 7C, the metal layer 75 is formed by using a plating method. By using the plating method, the metal layer 75 having a large film thickness is obtained. The metal layer 75 extends from the first region of the substrate 51 (bottom surface of the groove 69g) through the first end facet 69b of the stacked semiconductor layer 69a (side surface of the groove 69g) to the upper surface of the stacked semiconductor layer 69a. The metal layer 75 is also formed in the first trench groove 69c and the second trench groove 69d. In addition, the metal layer 75 is formed on the first terrace 69e and the second terrace 69f. In order to define a plating pattern to form the metal layer 75, a mask is formed by photolithography. The metal layer 75 does not cross the boundary of the device forming region and the edge of the metal layer 75 is apart from the boundary of the device forming region. This is for the purpose of facilitating the following production of a laser bar. After the formation of the electrical conductor layer 73 and the metal layer 75, a lower electrode 77 is formed on the back surface of the substrate 51.

Figure 8A:
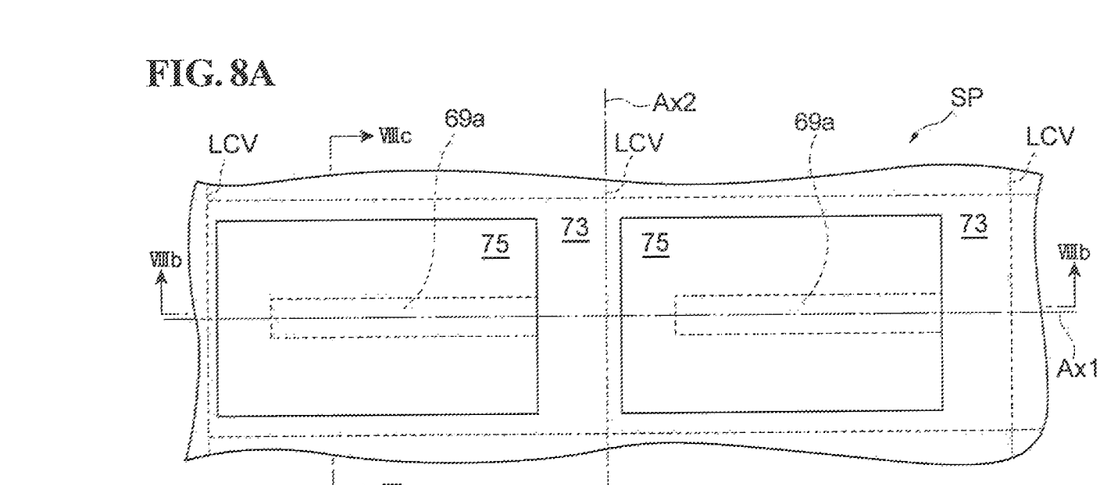
FIGS. 8A to 8C are diagrams schematically showing a substrate product formed in a main step in a method for manufacturing a quantum cascade laser.
Figure 8B:
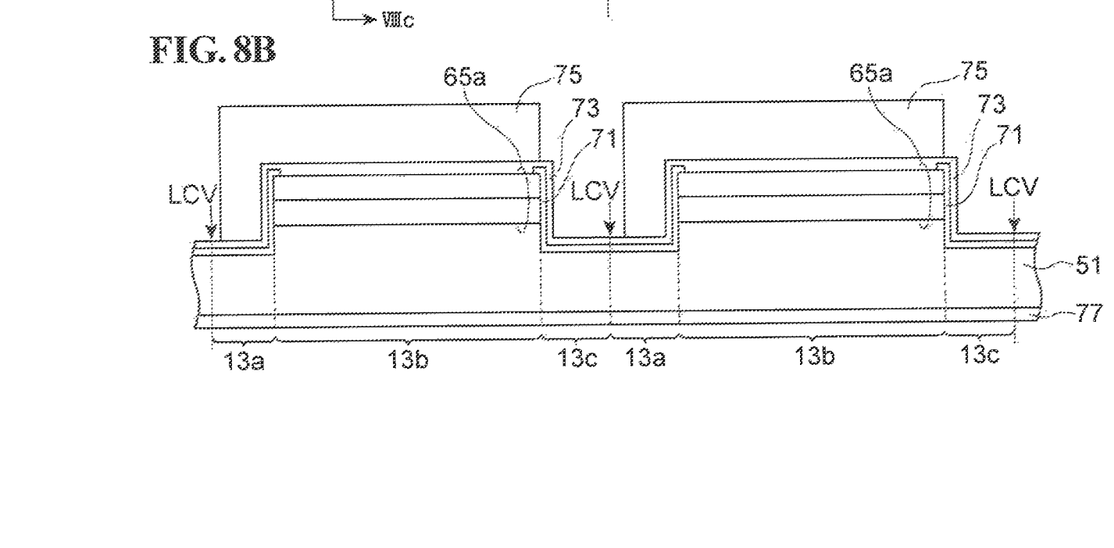
Figure 8C:
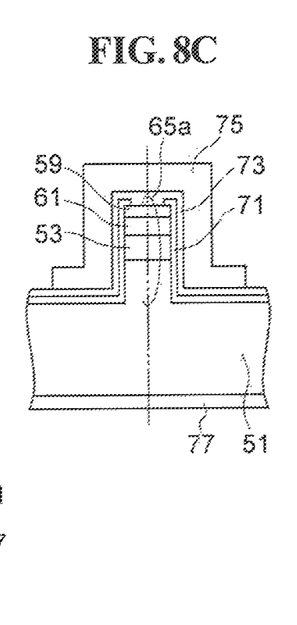

A substrate product SP, as shown in FIGS. 8A to 8C, is formed by these steps. FIG. 8A is a plan view showing the substrate product SP. FIG. 8B shows a cross-section taken along a line VIIIB-VIIIB shown in FIG. 8A. FIG. 8C shows a cross-section taken along a line VIIIC-VIIIC shown in FIG. 8A. Referring to FIG. 8A, two device forming regions are shown in the direction of the first axis Ax1. After the metal layer 75 and the back electrode 77 are formed, laser bars are formed from the substrate product SP. The laser bar is formed by, for example, cleaving the substrate product SP along the cleavage line LCV toward the direction of the second axis Ax2 intersecting the first axis Ax1 to divide the substrate product SP. The cleavage line LCV is apart from the edge of the metal layer 75 and passes the bottom surface of the groove 69g. Then the laser bar is divided into the individual chips, so that a plurality of quantum cascade lasers is obtained.

In one embodiment, the stacked semiconductor layer 69a is formed in such a way as to extend crossing the boundary line of the device forming region (cleavage lines). In this case, the stacked semiconductor layer 69a on the wafer is divided along the cleavage line. As a result, the quantum cascade laser having the second end facet of the stacked semiconductor layer including the cleavage surface is obtained, as shown in FIGS. 3A and 3C. The divided stacked semiconductor layer has a cleavage surface formed integrally with the end facet of the substrate.

In the wafer process according to the present embodiment, in forming the upper electrode including the electrical conductor layer 73 and the metal layer 75 on the upper surface of the stacked semiconductor layer 69a, the upper electrode is simultaneously formed on the first end facet 69b of the stacked semiconductor layer 69a. The upper electrode formed on the first end facet 69b of the stacked semiconductor layer 69a serves as a high reflection (HR) coating film. Consequently, after cleavage to form a laser bar, the step of forming a HR coating film on the end facet of the quantum cascade laser is unnecessary. For example, in the step of forming a stripe-shaped semiconductor mesa by etching, an end facet is formed in a direction perpendicular to the extension direction of the semiconductor mesa (waveguiding direction) and perpendicular to the principal surface of the substrate. Also, a film containing gold is formed on the upper surface and the end facet of the semiconductor mesa, so that an electrical conductor serving as an electrode and a reflection film is formed. A high reflection (HR) coating film having a large reflectance close to 100% in a lasing wavelength band of the quantum cascade laser is obtained by forming the metal layer having a large thickness on the rear end facet.

Another reflection mirror of the laser cavity is formed at a front end facet by forming a metal film on the front end facet, as shown in FIG. 3B. In this case, the metal film formed on the front end facet has a relatively small thickness and a reflectance lower than the reflectance of the rear end facet.

The quantum cascade laser according to the present embodiment includes a Fabry-Perot optical cavity having a high reflection end facet. Also, the end facet (reflection mirror) of the optical cavity is formed by a dry etching method with an etching mask having a predetermined pattern. Therefore, a length of laser cavity is defined by the mask pattern. Especially, the laser cavity having a relatively small length is obtained. For example, a small cavity length of about 200 µm or less is obtained for the quantum cascade laser.

Example 1

A multi-quantum well (MQW) structure, an n-type InP cladding layer, and an n-type GaInAs contact layer are grown sequentially on an n-type InP substrate by using a metal-organic vapor phase epitaxy (MOVPE) method. The multi-quantum well (MQW) structure includes a plurality of GaInAs layer and AlInAs layer that are stacked alternately. An etching mask is formed on the n-type GaInAs contact layer, and a stripe-shaped semiconductor mesa is formed by etching the MQW structure, the n-type InP cladding layer, and the n-type GaInAs contact layer using the etching mask. In the etching, a reactive ion etching (RIE) method is used. Simultaneously, an end facet serving as a reflection mirror of the laser cavity is formed in a direction perpendicular to the waveguiding direction at the stripe-shaped semiconductor mesa. In this example, the two end facets of the stripe-shaped semiconductor mesa opposing to each other are disposed inside the line of formation of the cleavage surface. The typical width of the semiconductor mesa is 10 µm, and the typical depth is 6 µm. After the semiconductor mesa is formed, an insulating layer composed of a silicon base inorganic insulating film (for example, SiN film, SiON film, $SiO_2$ film) or alumina (aluminum oxide) is formed on the entire surface. Specifically, the insulating layer is formed on the top portion and the end facets of the semiconductor mesa. The insulating layer has an opening in the top portion of the semiconductor mesa. This opening is formed by using, for example, photolithography and reactive ion etching (RIE). An upper electrode is formed in the opening by an evaporation method. The upper electrode is also formed on the end facets of the semiconductor mesa. The upper electrode is made of Ti/Au or Ti/Pt/Au. The upper electrode is in ohmic contact with the n-type GaInAs contact layer of the semiconductor mesa through the opening. Thereafter, a Au plating layer having a thickness of 5 µm is formed on the upper electrode on the top portion and the end facets of the semiconductor mesa. The Au plating layer formed on the end facet of the semiconductor mesa serves as a high reflection (HR) coating film. The back surface of the n-type InP substrate is polished so as to reduce its thickness to 100 µm. A lower electrode made of AuGe/Ni/Au is formed on the back surface of the n-type InP substrate. Thus, a substrate product is formed. The substrate product is cleaved and, thereby, a laser chip is formed. In this manner, a quantum cascade laser chip having mirror surfaces on both end facets of the semiconductor mesa is formed. The typical length of the laser chip in the waveguiding direction is 2 mm, and the width of the laser chip is 0.5 mm.

In the present example, the front end facet and the rear end facet of the semiconductor mesa are apart from the cleavage line at which the substrate is cleaved. In another example, the front end facet of the semiconductor mesa has a cleavage surface and the rear end facet of the semiconductor mesa is apart from the cleavage line. In these examples, a metal film is formed on the end facet so as to have a high reflectance. On the other hand, this end facet is apart from the semiconductor chip edge (cleavage line). Therefore, at least one end facet of the semiconductor mesa is formed inside the cleavage surface of the substrate. Consequently, the end facet having a high reflectance is formed during the wafer process. Accordingly, after forming a laser bar by cleavage, the step of forming a high reflection coating film on the end facet of the semiconductor mesa is omitted. In the production method of the present example, the metal layer (Au plating layer) serving as a high reflection (HR) coating film is formed together with the upper electrode during the wafer process.

As described above with reference to FIGS. 3A to 3D, the insulating layer 31 made of alumina is formed between the electrical conductor 17 and the first end facet 15a of the semiconductor mesa (stacked semiconductor layer 15). The electrical conductor 17 includes the conductive layer 23 and the metal layer 25 formed on the conductive layer 23. The metal layer 25 is made of a gold (Au) film. When the metal layer 25 has a thickness of 50 nm or more and the insulating layer 31 has a thickness of 600 nm, the first end facet 15a (rear end facet) of the semiconductor mesa has a high reflectance close to 100% and a low transmittance of substantially zero. On the other hand, the metal layer 25 having a typical thickness of about 20 nm is formed on the second end facet 15b (front end facet) to emit laser light toward the outside. In the example, the metal layer is formed on both rear end facet and front end facet of the semiconductor mesa to constitute a HR-HR structure. The rear end facet has a high reflectance and the front end facet has a smaller reflectance than that of the rear end facet. The reflectance of the end facet is adjusted by controlling the thickness of the metal layer (gold film). As shown in FIGS. 2A and 2B, the metal layer having a thickness of about 5 to 30 nm exhibits a reflectance of 70% to 95% and a transmittance of 0.5% to 5%. Preferably, the metal layer formed on the front end facet has a thickness of about 5 to 10 nm to exhibits a high transmittance of more than 1%. The HR-HR structure is formed by forming a thin metal layer (gold film) on the front end facet using an evaporation method and forming a thick metal layer (gold film) on the rear end facet using a plating method. By using the oblique evaporation method in which the wafer is placed in a slanting manner relative to an incident direction of a flux of evaporated particles, the metal layer is formed on the end facet of the semiconductor mesa perpendicular to the principal surface of the substrate. The inclination angle depends on an evaporation apparatus. In the present example, preferably, the principal surface of the substrate is inclined at an angle within the range of about 10 degrees to 30 degrees relative to the evaporation source. When the principal surface of the substrate is inclined at an angle larger than 30 degrees relative to the evaporation source, a film thickness of the metal layer formed on the end facet of the semiconductor mesa becomes too large to define the pattern of the metal layer by using a lift-off technique.

Example 2

Next, a mounting structure of the quantum cascade laser will be described. The quantum cascade laser is mounted on a sub-mount by using Au/Sn solder or indium (In) solder. When the quantum cascade laser is operated at low temperatures close to a liquid nitrogen temperature (77K), the quantum cascade laser mounted by using Au/Sn has a poor lasing characteristics because of a thermal stress generated between the InP substrate and the AuSn solder and/or the sub-mount. Consequently, indium (In) solder is preferably used for mounting the quantum cascade laser on the sub-mount, especially in operating the quantum cascade laser at low temperatures.

In the quantum cascade laser, the metal film made of gold (Au) is formed on the end facet to improve the reflectance of the end facet. If the metal film is formed on the entire end facet including the end facet of the substrate, indium (In) material easily flows from the sub-mount to the upper electrode through the metal film formed on the end facet (end facet of the substrate) when the indium (In) solder is used for mounting the quantum cascade laser on the sub-mount. In this case, an alloying reaction between indium (In) and gold (Au) occurs at the end facet. If the alloying proceeds excessively, the gold film becomes brittle. As a result, the reflectance of the end facet having the metal film made of gold (Au) is reduced. In addition, this alloying causes degradation of the active layer.

In the quantum cascade laser according to the present example, the end facet of the semiconductor mesa is retreated from the end facet of the substrate so as to form the set-back structure. The metal film is formed not on the end facet of the substrate but on the end facet of the semiconductor mesa. Therefore, the contact of the gold (Au) film on the end facet with indium (In) for mounting is avoided. In the present example, the end facet of the semiconductor mesa is formed by using a dry etching method. The depth of the semiconductor mesa is about 10 µm, whereas the thickness of the substrate is about 100 µm. The indium (In) solder used for the mounting did not flow toward the upper electrode because the metal film formed on the end facet of the semiconductor mesa and the indium (In) solder are separated from each other by a distance corresponding to the thickness of the substrate. When the quantum cascade laser chip is mounted on a sub-mount in an epi-side-up configuration, short-circuit does not occur between the upper and lower electrodes of the quantum cascade laser.

As described above, the quantum cascade laser having the HR-HR structure is mounted on the sub-mount by using indium (In) solder. The quantum cascade laser having the HR-HR structure is driven in the range of low temperatures close to the liquid nitrogen temperature to temperatures higher than or equal to room temperature without degradation of the lasing characteristics. Even when the indium (In) solder is used for mounting the quantum cascade laser on the sub-mount, a high reflection of the end facet of the semiconductor mesa is maintained and the quantum cascade laser having a high reliability is provided.

Principles of the present invention have been described on the basis of preferred embodiments with reference to the drawings. However, those skilled in the art will understand that the present invention can be changed in terms of arrangement and details without departing from such principles. The present invention is not limited to the specific configurations disclosed in the embodiments. Therefore, rights related to all modifications and changes within the scope and the spirit of the claims are claimed.

What is claimed is:

1. A quantum cascade laser comprising:
   a substrate having a first region and a second region arranged in a waveguiding direction;
   a stacked semiconductor layer disposed on the second region of the substrate, the stacked semiconductor layer including an active layer, the stacked semiconductor layer having a first end facet and a second end facet that constitute a laser cavity;
   an insulating layer disposed on the first end facet and an upper surface of the stacked semiconductor layer, the insulating layer having an opening on the upper surface of the stacked semiconductor layer;
   a conductive layer disposed on the insulating layer and in the opening, the conductive layer being in contact with the upper surface of the stacked semiconductor layer through the opening; and
   a metal layer disposed on the conductive layer on the first end facet and the upper surface of the stacked semiconductor layer,
   wherein the first end facet of the stacked semiconductor layer is retreated from an end facet of the substrate to a boundary between the first region and the second region of the substrate in the waveguiding direction.

2. The quantum cascade laser according to claim 1, wherein
   the stacked semiconductor layer constitutes a semiconductor mesa extending in the waveguiding direction, and
   the first end facet and the second end facet of the stacked semiconductor layer correspond to end facets of the semiconductor mesa that are opposed to each other in the waveguiding direction.

3. The quantum cascade laser according to claim 1, wherein the first end facet of the stacked semiconductor layer with the metal layer has a reflectance of more than 70%.

4. The quantum cascade laser according to claim 1, wherein
   the metal layer is made of a gold film, and
   the metal layer has a thickness of 50 nm or more.

5. The quantum cascade laser according to claim 1, wherein the first end facet of the stacked semiconductor layer has a reflectance larger than a reflectance of the second end facet of the stacked semiconductor layer.

6. The quantum cascade laser according to claim 1, wherein
   the substrate has a third region arranged adjacent to the second region in the waveguiding direction,
   the insulating layer is disposed on the second end facet of the stacked semiconductor layer,
   the metal layer is disposed on the conductive layer on the second end facet of the stacked semiconductor layer,
   the second end facet of the stacked semiconductor layer is retreated from another end facet of the substrate to a boundary between the second region and the third region of the substrate in the waveguiding direction, and
   the metal layer disposed on the second end facet of the stacked semiconductor layer has a thickness smaller than a thickness of the metal layer disposed on the first end facet of the stacked semiconductor layer.

7. The quantum cascade laser according to claim 1, wherein the second end facet of the stacked semiconductor layer has a cleavage surface.

* * * * *